(12) United States Patent
Krumrey et al.

(10) Patent No.: US 8,889,512 B2
(45) Date of Patent: Nov. 18, 2014

(54) METHOD AND DEVICE INCLUDING TRANSISTOR COMPONENT HAVING A FIELD ELECTRODE

(75) Inventors: Joachim Krumrey, Goedersdorf (AT); Gerhard Noebauer, Villach (AT); Martin Poelzl, Oissach (AT); Marc Probst, Radeberg (DE)

(73) Assignee: Infineon Technologies Austria AG, Villach (AT)

( * ) Notice: Subject to any disclaimer, the term of this patent is extended or adjusted under 35 U.S.C. 154(b) by 364 days.

(21) Appl. No.: 13/281,829

(22) Filed: Oct. 26, 2011

(65) Prior Publication Data
US 2012/0040505 A1 Feb. 16, 2012

Related U.S. Application Data

(62) Division of application No. 12/605,933, filed on Oct. 26, 2009, now Pat. No. 8,072,028.

(51) Int. Cl.
*H01L 21/336* (2006.01)
*H01L 29/66* (2006.01)
*H01L 29/78* (2006.01)
*H01L 29/40* (2006.01)
*H01L 29/06* (2006.01)
*H01L 29/423* (2006.01)
*H01L 29/417* (2006.01)

(52) U.S. Cl.
CPC ......... *H01L 29/7813* (2013.01); *H01L 29/0696* (2013.01); *H01L 29/66734* (2013.01); *H01L 29/7811* (2013.01); *H01L 29/4238* (2013.01); *H01L 29/66727* (2013.01); *H01L 29/41766* (2013.01); *H01L 29/7803* (2013.01); *H01L 29/407* (2013.01)
USPC .......................................... 438/270; 438/595

(58) Field of Classification Search
USPC .................................... 438/270, 595
See application file for complete search history.

(56) References Cited

U.S. PATENT DOCUMENTS

| | | | |
|---|---|---|---|
| 7,186,618 B2 | 3/2007 | Polzl et al. | |
| 7,859,047 B2 | 12/2010 | Kraft et al. | |
| 2005/0145936 A1 | 7/2005 | Polzl et al. | |
| 2007/0037327 A1* | 2/2007 | Herrick et al. | 438/151 |
| 2008/0042172 A1 | 2/2008 | Hirler et al. | |
| 2009/0218618 A1 | 9/2009 | Blank | |

OTHER PUBLICATIONS

Office Action mailed Feb. 7, 2011 in U.S. Appl. No. 12/605,933.

* cited by examiner

*Primary Examiner* — Long Pham
(74) *Attorney, Agent, or Firm* — Dicke, Billig & Czaja, PLLC

(57) ABSTRACT

A transistor component and method of forming a transistor component. One embodiment provides a semiconductor arrangement including a semiconductor body having a at least one first trench, a first field electrode arranged in the lower trench section of the at least one first trench and being insulated from the semiconductor body by a field electrode dielectric. A dielectric layer is formed on the first field electrode in the at least one first trench, including depositing a dielectric material on a first side of the semiconductor body and on the field plate at a higher deposition rate than on sidewalls of the at least one first trench.

19 Claims, 15 Drawing Sheets

METHOD AND DEVICE INCLUDING TRANSISTOR COMPONENT HAVING A FIELD ELECTRODE

CROSS-REFERENCE TO RELATED APPLICATIONS

This Divisional Patent Application claims priority to U.S. patent application Ser. No. 12/605,933, filed on Oct. 26, 2009, which is incorporated herein by reference.

TECHNICAL FIELD

The present disclosure relates to a transistor component having a field electrode below a gate electrode, and to a method of producing such transistor component.

BACKGROUND

In transistors having a field electrode below a gate electrode and adjacent to a drift zone the field electrode has different functions: it reduces the a gate-drain capacitance of the component; it shields the gate electrode against high electric field strengths, if the component is in its blocking state; and it compensates charge carriers in the drift zone, if the component is in its blocking state, thereby increasing a maximum blocking voltage of the component.

The field electrode and the gate electrode are insulated from one another by a dielectric layer, with the gate electrode, the field electrode and this dielectric layer forming a capacitor. For a given dielectric constant of the dielectric layer between the gate and the field electrode a capacitance of this capacitor decreases with increasing thickness of the dielectric layer.

For these and other reasons, there is a need for the present invention.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

Examples will now be explained with reference to the accompanying drawings and the description below. The drawings are intended to explain the basic principle. Thus, only those features relevant for illustrating the basic principle are illustrated. Unless stated otherwise, same reference characters designate the same features with the same meaning throughout the drawings.

DETAILED DESCRIPTION

Figure 1A:
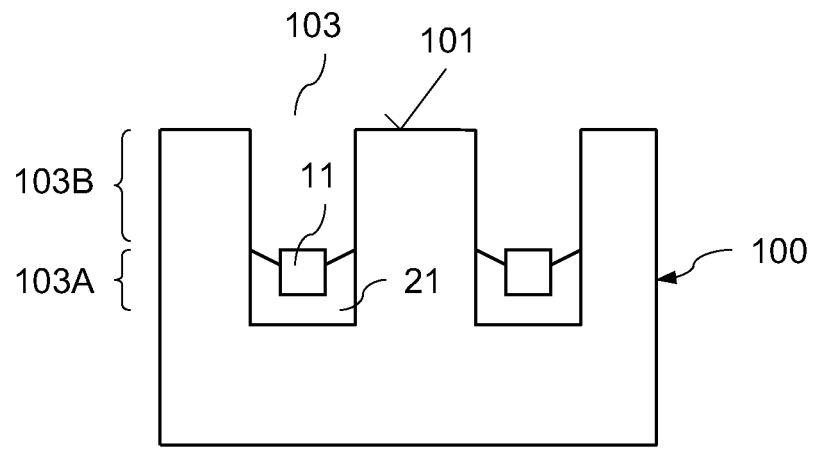
FIGS. 1A-1F, illustrate one embodiment of a method of producing a transistor component having a field electrode and a gate electrode and a deposited inter-electrode dielectric arranged between the gate electrode and the field electrode.

In the following Detailed Description, reference is made to the accompanying drawings, which form a part hereof, and in which is illustrated by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One or more embodiments of a transistor device and method, provide for adjusting a thickness of the dielectric layer between the gate and the field electrodes independently of other dielectric layers, such as a gate dielectric layer, in the component. In one embodiment, the method and device includes a thick dielectric layer between the gate and the field electrodes.

One embodiment provides a method of forming a transistor component and forming a device having a transistor component. The method includes providing a semiconductor arrangement having a semiconductor body having a first side and at least one first trench extending from the first side into the semiconductor body. The at least one first trench has sidewalls and lower and upper trench sections. A first field electrode is arranged in the lower trench section of the at least one first trench and insulated from the semiconductor body by a field electrode dielectric. The method further includes forming a dielectric layer on the first field electrode in the at least one first trench, forming the dielectric layer including a deposition process that deposits a dielectric material on the first side of the semiconductor body and on the field plate at a higher deposition rate than on sidewalls of the at least one first trench. A gate dielectric is formed, the gate dielectric at least lining the sidewalls in the upper trench section of the at least one first trench; forming a gate electrode in the upper trench section, the gate electrode being insulated from the first field electrode by the dielectric layer.

Another embodiment provides a transistor component and device including a transistor component, including a semiconductor body having a first side and at least one first trench extending from the first side. The at least one first trench includes sidewalls and lower and upper trench sections. A first field electrode is arranged in the lower trench section of the at least one first trench and is insulated from the semiconductor body by a field electrode dielectric. A dielectric layer is positioned on the first field electrode in the at least one first trench. A gate dielectric is provided, the gate dielectric at least lining the sidewalls in the upper trench section of the at least one first trench. A gate electrode is in the upper trench section, the gate electrode being insulated from the first field electrode by the dielectric layer, a thickness of the dielectric layer being at least half of the vertical length of the field plate.

FIGS. 1A trough 1F schematically illustrate one embodiment of a process for forming a transistor component having a field electrode and a gate electrode. These figures illustrate the component at various stages of an exemplary process sequence for forming the component.

Referring to FIG. 1A the process sequence starts with providing a semiconductor arrangement that includes a semiconductor body 100 having a first side 101, that will be referred to as front side in the following. FIGS. 1A through 1J show a vertical cross section through the semiconductor body 100, that is a cross section in a plane that runs perpendicular to the front side 101.

Semiconductor body 100 includes at least one first trench 103 that starting from the front side 101 extends into the semiconductor body 100. In the present example the at least one trench 103 extends in the vertical direction into the semiconductor body 100. In the example the at least one first trench 103 has a rectangular cross section in the vertical plane. However, this is only an example, the at least one first trench 103 could have any other trench cross section. According to one embodiment sidewalls of the trench are tapered (not illustrated) so that the at least one first trench 103 narrows with increasing depths. Further edges between sidewalls and a bottom of the at least one first trench could be rounded.

The at least one first trench 103 has a lower trench section 103A and an upper trench section 103B. A first field electrode 11 is arranged in the lower trench section 103A and is dielectrically insulated from the semiconductor body 100 by a first field plate dielectric 21 in this lower trench section 103A. For this purpose first field plate dielectric 21 is arranged between the first field electrode 11 and the bottom and the sidewalls of the trench 103 in the lower trench section 103A.

First field electrode 11 is, for example, made of a metal or a doped polycrystalline semiconductor material, such as polysilicon. First field electrode dielectric 21 is, for example, made of an semiconductor oxide, such as silicon oxide. An example embodiment of a method for producing first field electrode 11 and first field electrode dielectric 21 will be explained with reference to FIG. 7.

The at least one first trench 103 is deep, in one embodiment between about 0.75 µm and about 7.5 µm from the first side 101 to its bottom depending on the breakdown voltage class, i.e. the desired voltage blocking capability, of the MOSFET.

In one embodiment, width of the trench is between about 0.25 µm and about 2.5 µm. A thickness of the first field electrode dielectric 21 is, for example, between about 75 nm and about 750 nm. The field electrode 11 has a vertical length between about 25% up to almost 100% of the depth of the trench 103. In a transistor component having a voltage blocking capability of, for example, 150 V trench 103 has a depth of between 6 µm and 7 µm, and a body zone (that will be explained further below) has a vertical dimension of between about 0.5 µm and 1 µm. The vertical dimensions of the field electrode correspond to about the deepness of the trench minus the vertical dimension of the body zone.

The distance between two trenches 103 in a direction perpendicular to a longitudinal direction of the trenches 103 is between about 0.3 µm and 3 µm, this distance corresponding to a dimension of the semiconductor body 100 mesa region between he two trenches.

The lower section 103A of the at least one first trench 103 is the section that includes the first field electrode 11, the upper section 103B is the section between first field electrode 11 and the first side 101.

Figure 1B:
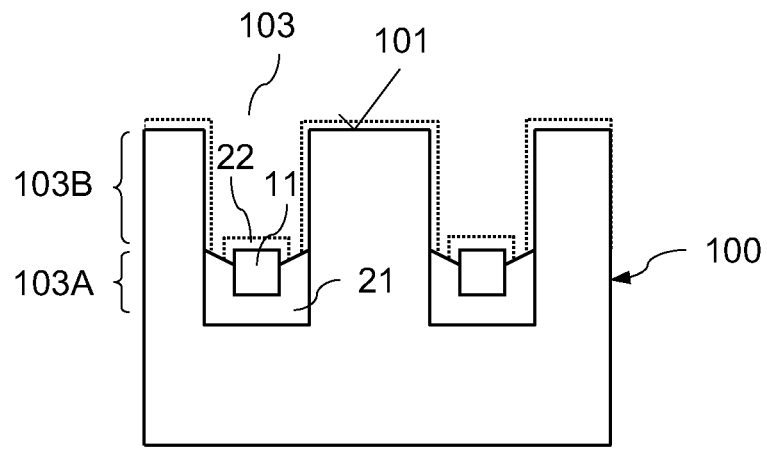

In an optional method process that is illustrated in FIG. 1B a dielectric layer 22 is formed on sections of the first field electrode 11 that are not covered by the first field electrode dielectric 21. This dielectric layer 22 is relatively thin as compared to the field electrode dielectric 21 and is also formed on sidewalls of the first trench 103 in the upper trench section 103B and on the front side 101. Forming this dielectric layer 22 is optional, i.e. the method processes that will now be illustrated with reference to FIG. 1C may be performed without first producing the thin dielectric layer 22.

Figure 1C:
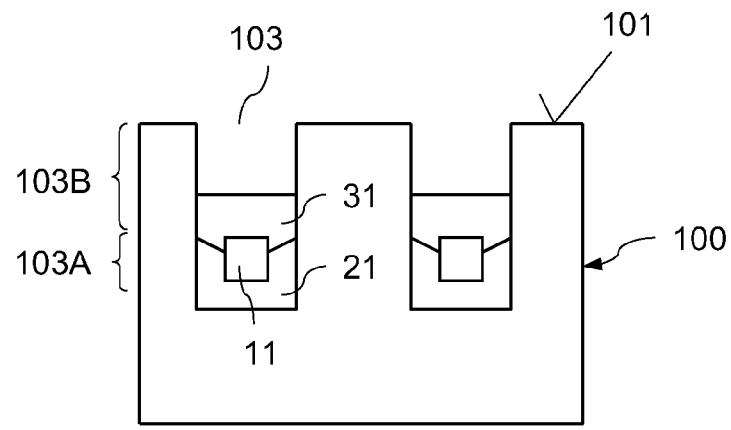

Referring to FIG. 1C a dielectric layer 31 is formed on the first field electrode 11 in the at least one first trench 103. This dielectric layer in the component to be produced will be arranged between the first field electrode 11 and a gate electrode, and will, therefore, be referred to as inter-electrode dielectric in the following. Forming inter-electrode dielectric layer 31 involves a deposition process that deposits a dielectric material on the first side of the semiconductor body 101 and on the field plate 11, the deposition process having a higher deposition rate on the front side 101 and on the bottom of the upper trench section 103B—where the first field electrode 11 is located—than on sidewalls of the upper trench section 103B. Forming inter-electrode dielectric layer 31 further involves at least partly removing the deposited dielectric material from the first side 101 and the sidewalls of the upper trench section 103B. In the example as illustrated in FIG. 1C the dielectric material has completely been removed from the first side 101 and the sidewalls of the upper trench section 103B, while remaining on or above the first field electrode 11. The dielectric material remaining on the first field electrode 11 forms the inter-electrode dielectric 31.

Figure 1D:
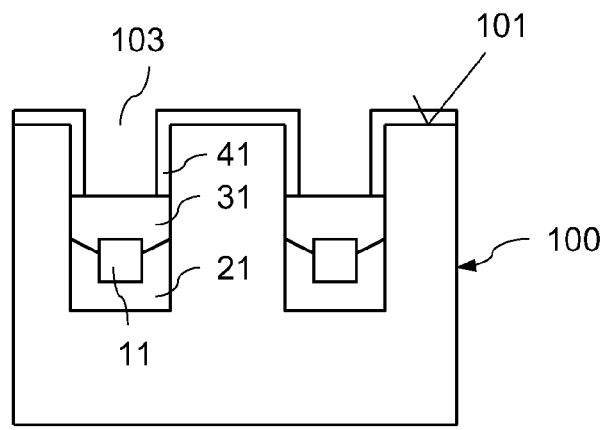

Forming the inter-electrode dielectric 31 partly fills the upper trench section. Referring to FIG. 1D a gate dielectric 41 is formed on sidewalls of the upper trench section that remains after forming inter-electrode dielectric 31. Gate dielectric 41 is, for example, formed by a thermal oxidation process.

Figure 1E:
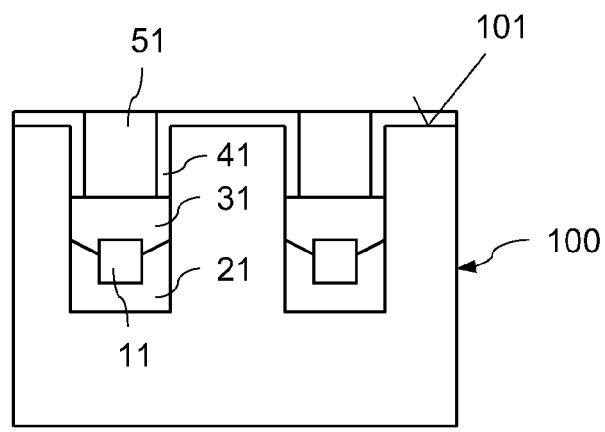

Referring to FIG. 1E the upper section of the at least one trench 103 that remains after forming inter-electrode dielectric 31 and the gate dielectric 41 is filled with an electrode material, thereby forming a gate electrode 51. The electrode material is, for example, a metal or a doped polycrystalline semiconductor material, such as polysilicon.

Figure 1F:
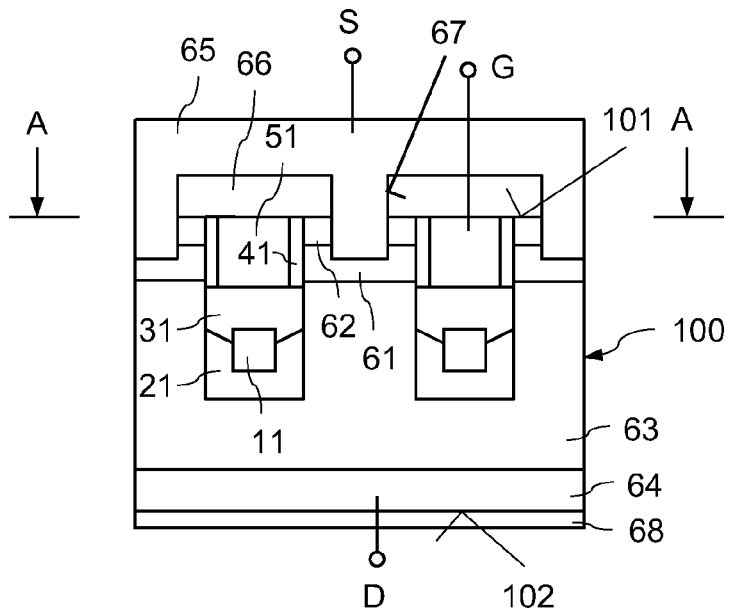

Referring to FIG. 1F the component is completed by forming a body zone 61 in the semiconductor body 100 adjacent to gate dielectric 41, a source zone 62 in the body zone 61 and adjacent to the gate dielectric 41, and a source electrode 65 contacting source zone 62 and body zone 61. Body zone 61 and source zone 62 are, for example, formed by implanting dopants via the first side 101 into the semiconductor body 100 before forming source electrode 65. Source electrode 65 in a contact trench 67 extends into the body zone 61 and in this contact trench contacts source zone 62 and body zone 61. However, this is only an example, any other suitable means for contacting body zone 61 and source zone 62 by source electrode 65 may be applied as well. Source electrode 65 is electrically insulated from gate electrode 61 by an insulation layer 66.

The transistor component illustrated in FIG. 1F is a trench field-effect transistor or trench MOS transistor in which gate electrode 51 is arranged in a trench. Methods for forming a body zone, like body zone 61, a source zone, like source zone 62, and a source electrode, like source electrode 65, of a trench MOSFET are commonly known, so that no further explanations are required.

Referring to FIG. 1F the component further includes a drift zone 63 and a drain zone 64, drain zone 64 being contacted by a drain electrode 68. Drain electrode 68 is, for example, comprised of a metal. Drift zone 63 is arranged between the drain zone 64 and body zone 61 and is separated from source zone 62 by body zone 61. In the example illustrated in FIG. 1F drain zone 64 adjoins a second side 102 of the semiconductor body 100. The second side lies opposite to the first side 101 and will be referred to as a back side of the semiconductor body 100 in the following. Forming drain zone 64 adjacent to the back side 102 is only an example. Drain zone 64 may also be realized as a buried layer (not illustrated) that is contacted via a diffused region from the front side 101 of the semiconductor body.

Semiconductor body 100 may include two differently doped semiconductor layers: a higher doped first layer that forms drain zone 64; and a lower doped second layer in which the at least one first trench 103 with the field electrode 11 and gate electrode 51, body zone 61 and source zone 62 are formed. Regions having the background doping of the second layer form the drift zone 63 of the component in this example. The first layer is, for example, a semiconductor substrate. The second layer is, for example, an epitaxial layer formed on the substrate. Instead of using a semiconductor body that has two differently doped layers, a uniformly doped semiconductor substrate can be used as well, with a background doping of the semiconductor substrate corresponding to the doping of the drift zone 63. In this case drain zone 64 is formed by implanting dopants into the back side 102 of the semiconductor substrate.

In one or more embodiments, the component can be a MOSFET or an IGBT. The conductivity type of the device is governed by the doping type of source region 62. In an n-type (n-channel) device source region 62 is n-doped, while body zone 61 is p-doped. Drift region 63 has the same conductivity (doping) type as source zone 62. In a MOSFET drain zone 64 is of the same conductivity type as source zone 62, and in an IGBT drain zone 64 is doped complementarily to source zone 62. In a p-channel device the doping types of corresponding device zones are complementary to the doping types in an n-type device. In an IGBT a field-stop zone (not illustrated) of the same conductivity type as drift zone 63, but more highly doped, may be arranged between drain zone 64 and drift zone 63 or in the drift zone 63 distant to drain zone 64.

The transistor component has three terminals: a gate terminal G that contacts gate electrode 51; a source terminal S that contacts source electrode 64; and a drain terminal D that contacts drain zone 64. These terminals are only schematically illustrated in FIG. 1F.

The component as illustrated in FIG. 1F may include a number of identical transistor structures that are commonly referred to as transistor cells. Each transistor cell includes a source zone 62, a gate electrode 51, and a body zone 61, where two or more cells may share a gate electrode 51 and a body zone 61. In the example as illustrated in FIG. 1F the transistor cells share drift zone 63 and drain zone 64. The transistor cells are connected in parallel as the gate electrodes 51 are commonly connected to gate terminal G, and as the source zones 62 are commonly connected to source terminal S. Transistor cells may have a stripe-geometry. In this case, gate electrodes 51 of the individual cells run parallel to each other in a horizontal direction of the semiconductor body 100.

Figure 2A:
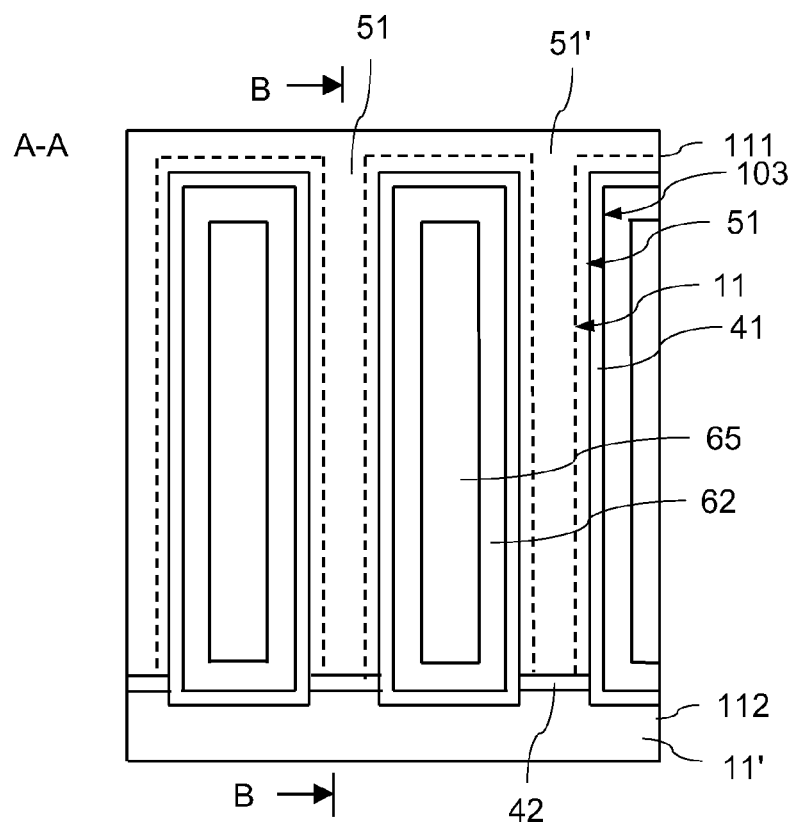
FIGS. 2A-2B, by way of a horizontal (FIG. 2A) and a vertical (FIG. 2B) cross section through the transistor component, illustrate one embodiment of a way of contacting the gate electrode and the field electrode.
Figure 2B:
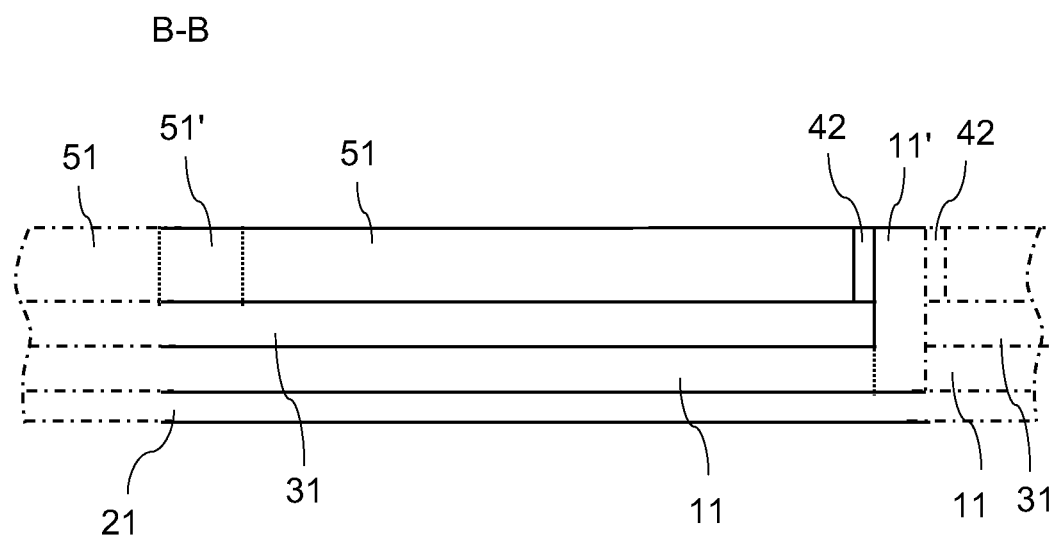

FIG. 2A illustrates a cross section in a horizontal plane A-A through one embodiment of an integrated circuit including a semiconductor body 100 in which stripe-shaped transistor cells are integrated. FIG. 2A illustrates the cross section in a region close to the front side 101. FIG. 2B illustrates a cross section in a vertical section plane B-B that is illustrated in FIG. 2A. Vertical section plane B-B cuts through the field and gate electrodes 11, 51 in their longitudinal directions.

As can be seen from FIG. 2A, the gate electrodes 51 and the source zone 62 of several transistor cells run parallel to each other in the horizontal plane. Similar to the gate electrodes 51 the first field electrodes 11 of the transistor cells also run parallel to each other. The first field electrodes 11 that, seen from the front side 101, are arranged below the gate electrodes 51 are schematically illustrated in FIG. 2A by dashed lines.

For contacting gate electrodes 51 in common, the device may include a first contact trench 111 that runs perpendicular to the first trenches 103 in the horizontal direction and adjoins the first trenches 103. This additional trench 111 includes a first contact electrode 51' that contacts the gate electrodes 51 arranged in the first trenches 103. These gate electrodes 51 can be contacted by contacting the first contact electrode 51' in the further trench 111. As can be seen from FIG. 2B the field electrodes 11 are electrically insulated from the first contact electrode 51'.

For contacting the field electrodes 11 the device may include a second contact trench 112 that includes a second contact electrode 11'. The first and the second contact trench 111, 112 are arranged distant to one another in a longitudinal direction of the trenches 103 and, for example, run perpendicular to these trenches 103. The second contact electrode 11' contacts the field electrode but is insulated from the gate electrodes 51 by a further dielectric layer 42. Second contact electrode 11' extends to the front side 101 of the semiconductor body, so that the first field electrodes 11 can be contacted from the first side 101 via contact electrode 11'.

The component may include a plurality of first and second contact electrodes 51', 11' that contact the gate electrode 51 and the field electrodes 11, respectively, in a way illustrated in FIGS. 2A and 2B. Referring to FIG. 2B (see the dash-dotted lines) the trenches that include the gate and the field electrodes 51, 11 may extend beyond the two contact trenches 111, 112 that are illustrated in FIG. 2A. In an arrangement having a plurality of first and second contact electrodes 51', 11' the first and the second contact electrodes 51', 11' may be arranged alternately, distant to one another in a longitudinal direction of the trenches, and perpendicular to the trenches that include the gate and the field electrodes 51, 11.

Figure 3A:
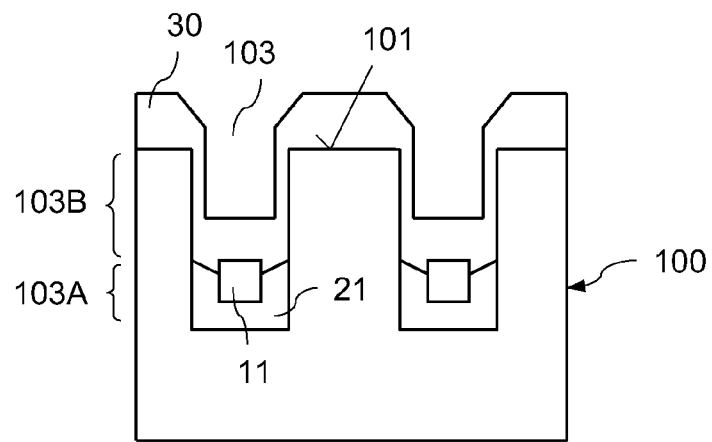
FIGS. 3A-3D, illustrate one example embodiment of a method of producing an inter-electrode dielectric.

FIGS. 3A through 3D illustrate a first example embodiment of a process sequence for forming inter-electrode dielectric 31 that has been explained with reference to FIG. 1D. Referring to FIG. 3A forming inter-electrode dielectric 31 involves depositing a dielectric layer 30 on the first field electrode 11 in the at least one first trench 103 as well as on the first side 101 of the semiconductor body 100. A deposition process used for depositing dielectric layer 30 is a selective deposition process having a deposition rate that is dependent on an orientation of surfaces on which the dielectric layer 30 is to be deposited. As illustrated in FIG. 3A the deposition process has a higher deposition rate on horizontal surfaces than on vertical surfaces. In the present case horizontal surfaces are the first side 101 and the bottom of the upper trench section 103B. This bottom of the upper trench section 103B is partly formed by the first field electrode 11 and/or optional dielectric layer 22 (see FIG. 1B). Resulting from the different deposition rates dielectric layer 30 has a higher thickness at the bottom of upper trench section 103B and on the first side 101 than on sidewalls of the upper trench section 103B. In one embodiment, the deposition process is, for example, a high density plasma (HDP) process. The thickness of the dielectric layer 30 that is deposited on horizontal surfaces, like on the first field electrode 11, is, for example, between 200 nm and 300 nm. HDP processes are plasma supported deposition/sputter processes that are commonly known, so that no further explanations are required.

Figure 3B:
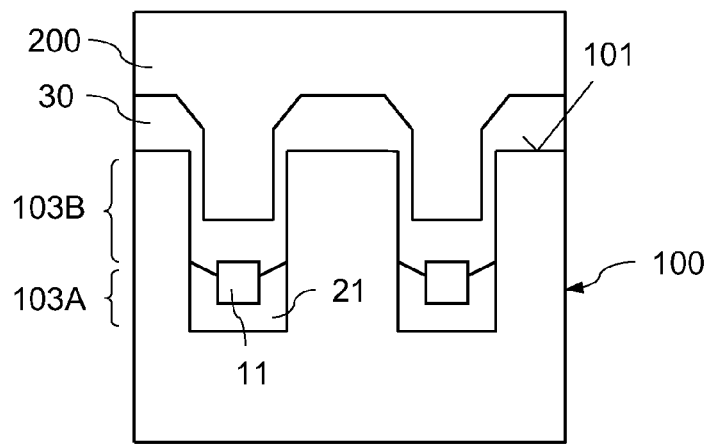

Referring to FIG. 3B a protection layer 200, such as a resist layer, is formed on the deposited dielectric layer 30. Protection layer 200 completely covers dielectric layer 30 and completely fills those parts of the upper trench section 103B that remain after forming the dielectric layer 30. Protection layer 200 is, for example a resist, a carbon, or a carbon-containing layer that can be removed selectively relative to the deposited dielectric layer.

Figure 3C:
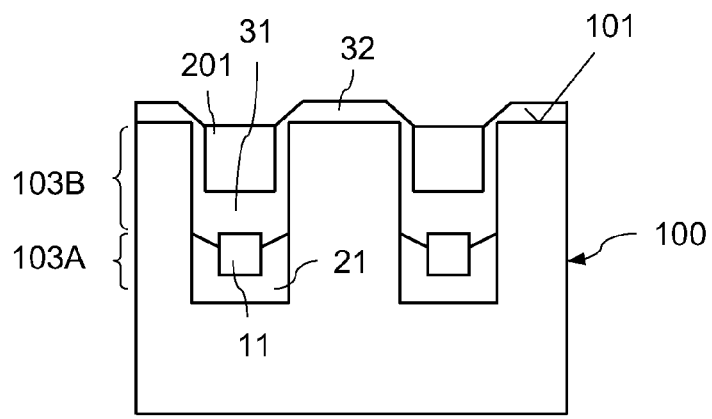

Referring to FIG. 3C protection layer 200 is completely removed from those sections of the dielectric layer 30 covering the front side 101, and these sections of dielectric layer 30 covering the front side 101 are at least partly removed from the front side 101. "At least partly removing" in this connection means that a thickness of dielectric layer 30 is at least reduced, if not completely removed. The process of removing the protection layer 200 and partly removing the dielectric layer 30 above the front side, i.e. above the mesa region, stops before the protective layer 200 is completely removed from the at least one first trench 103, so that a plug 201 of protective material remains in the trench 103. This plug 201 protects those parts of the dielectric layer 30 that cover the first field electrode 11 and that form the inter-electrode dielectric 31. In the example as illustrated in FIG. 2C parts 32 of dielectric layer 30 remain on the first side 101 and plug 201 completely fills the upper trench section 103B. However, this is only an example, the process of removing the protection layer 200 and dielectric layer 30 could also proceed until the dielectric layer is completely removed from the first side 101 and until plug 201 only partly fills the upper trench section, but still covers first field electrode 11.

The process of partly removing protection layer 200 and dielectric layer 30 may involve an etch process that etches both, the material of the protection layer 200 and the material of the dielectric layer 30. The etch selectivity for etching the protection layer 200 and the dielectric layer 30 is, for example, 1:1. This means, that protection layer 200 and dielectric layer 30 are substantially equally etched. However, this etch selectivity may vary in a range of, for example, 0.5:1 to 1:0.5. The etching process is, for example, a dry etching process that may include an oxygen plasma and chlorine.

Figure 3D:
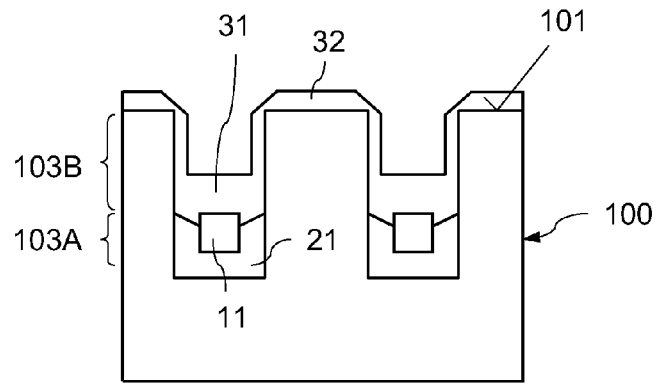

Referring to FIG. 3D plug 201 of protection material is removed from the upper trench section 103B. Removing plug 201 may involve a thermal process that ashes plug 201 but leaves the remaining parts of dielectric layer 30, such as inter-electrode dielectric 31.

In an ideal case the deposition rate on the sidewalls of the upper trench section 103B is zero when depositing dielectric layer 30. In this case the semiconductor body 100 is not covered by a dielectric layer at the sidewalls of the least one first trench after plug 201 has been removed. However, in a non-ideal case some dielectric material is deposited on the sidewalls. Typically a thickness of the dielectric layer deposited on the sidewalls is between 5 nm and 200 nm. In order to produce inter-electrode dielectric 31 completely independent of gate dielectric 41 the dielectric materials covering the sidewalls after plug 201 has been removed is removed before forming the gate dielectric (41 in FIG. 1D).

Removing the dielectric material from the sidewalls may involve an isotropic etch process that also etches parts of the dielectric layer 30 that have remained on the front side 101 after the end of the removal process that has been illustrated with reference to FIG. 3C. This etch process may also etch parts of the inter-electrode dielectric 31.

Figure 4:
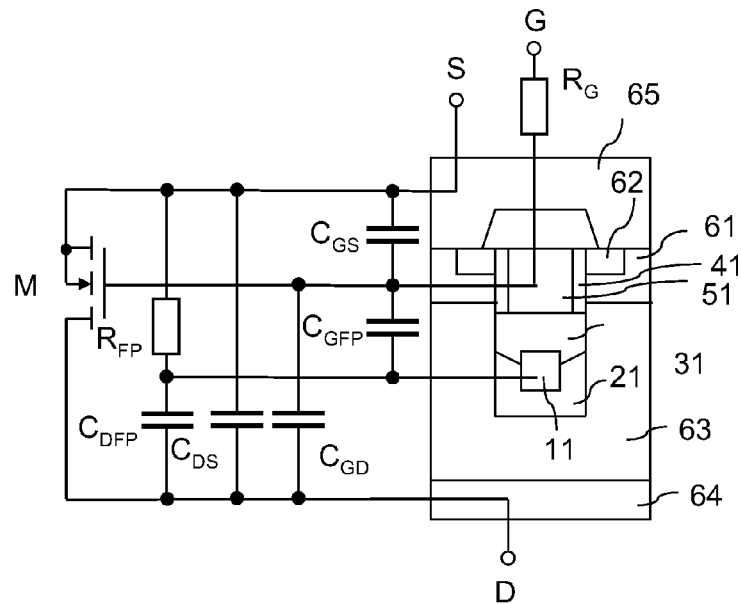
FIG. 4 illustrates one embodiment of a transistor cell of the transistor component as produced by the method illustrated in FIG. 1 and illustrates circuit symbols of inherent components of the transistor cell.

FIG. 4 schematically illustrates a transistor cell of a transistor component produced in accordance with the method as explained with reference to FIG. 1. FIG. 4 further shows the circuit symbol M of the transistor component as well as circuit symbols of parasitic resistances and capacitances of the transistor component. The transistor symbol M illustrated in FIG. 4 relates to an n-channel MOSFET. However, this is only an example. The circuit diagram as illustrated in FIG. 4 also applies to a p-channel MOSFET in an equivalent manner. As illustrated in FIG. 4 the component has five relevant inherent capacitances: a gate-source capacitance $C_{GS}$ that is formed by gate electrode 51, gate dielectric 41, source zone 62, body zone 61 and source electrode 65; a gate drain capacitance $C_{GD}$ that is formed by gate electrode 51, gate dielectric 41 and drift zone 63; a drain-source capacitance $C_{DS}$ formed by drift zone 63 and body zone 61; a gate-field-electrode capacitance $C_{GFP}$ that is formed by gate electrode 51, inter-electrode dielectric 31 and first field electrode 11; and a drain-field-plate capacitance $C_{DFP}$, that is formed by first field electrode 11, field electrode dielectric 21, drift zone 63 and drain zone 64. First field electrode 11 is either electrically connected to source terminal S or to gate terminal G. for explanation purposes it is assumed that field electrode 11 is electrically connected to source terminal S. In this case there is a field-electrode resistance $R_{FP}$ between source terminal S and field electrode 11. The component further includes a gate resistance $R_G$ that is present between gate terminal G and gate electrode 51. Both $R_{FP}$ as well as $R_G$ are no lumped resistors but rather inherent differential resistances of incremental elements of the stripe-shaped electrodes.

The capacitances and parasitic inductances $L_{STRAY}$ influence the switching behaviour of the component. In particular in applications in which the transistor M is alternately biased in its reverse direction and forward direction high frequent oscillations may occur. FIG. 5 illustrates an example of such an application. In this example transistor M acts as a low-side switch of a half-bridge circuit. For this purpose load path (drain-source-path) of transistor M is connected in series to a high-side switch HS, the series circuit with the low-side and the high-side switches is connected between terminals for supplying an input voltage Vin. A circuit node common to low-side and high-side switch forms an output, that is also referred to as phase node PN, of the half-bridge circuit. In the present example an inductive load is connected to the phase node. Inductive load includes at least one inductance L. In the example as illustrated in FIG. 5 the inductive load is an output stage of a buck converter that besides inductance L includes an output capacitance C for providing an output voltage Vout. A series circuit including inductance L and output capacitance C is connected parallel to low-side switch M.

In this circuit low-side switch M acts as a free-wheeling element that by control signal S2 is switched on each time high-side switch HS by a control signal S1 is turned off. If high-side switch HS is turned on and low-side switch M is turned off load L, C is connected to the input voltage Vin. Subsequently high-side switch HS turns off and low-side signal S2 turns on low-side switch M which allows a freewheeling current to flow driven by the inductive load. In order to avoid shoot-through currents between the supply terminals there is a delay time (dead time) between switching off low-side switch M and switching on high-side witch HS and vice versa. During the dead time the internal body diode BD of the transistor component takes over the freewheeling current. Referring to the cross section illustrated in FIG. 4 the body diode between source and drain terminal S, D is formed by the pn-junction between body zone 61, that is contacted by source electrode 65, and drift zone 63. In an n-type transistor a forward direction of the body diode is from source S to drain D.

Figures 5A, 5B:
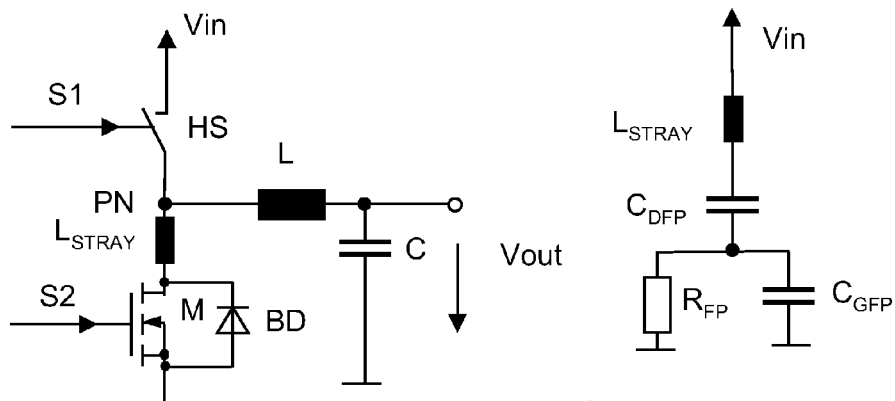
FIGS. 5A, 5B illustrate one embodiment of an application including a transistor component as a Low-Side switch and a simplified equivalent circuit for the commutation of the Low-Side switch.

In the application illustrated in FIG. 5A the body diode of Low-Side-Switch M is forward biased when low-side switch M is switched off and until high-side switch HS switches on. At a time when high-side switch HS switches on the body diode of low-side switch M is reverse-biased. At this time an abrupt voltage change occurs across drain-source-path of low-side switch M. This abrupt voltage change excites an oscillator circuit that is formed by the transistor capacitances and parasitic stray inductances that are present in the half-bridge having input supply voltage source Vin, high-side switch HS and low-side switch M. These stray inductances are represented by a lumped inductance $L_{STRAY}$ in FIG. 5A. The excited oscillator circuit causes voltage overshoots at the phase node which may harm the output stages of the driver for the high-side switch. It can be illustrated that relevant components for damping such oscillations in the parasitic oscillator circuit are the gate-field-plate capacitance $C_{GFP}$ and field-plate resistance $R_{FP}$.

In typical applications the frequency of the parasitic oscillations is in a range of between 100 MHz and 200 MHz. At this frequency the (AC) impedance of the gate-source capacitance $C_{GS}$ is significantly smaller than the gate resistance $R_G$. For damping purposes gate resistance $R_G$ may therefore be neglected compared with gate-source capacitance $C_{GS}$. Further, the gate-field-plate capacitance $C_{GFP}$ is usually smaller than the gate-source capacitance $C_{GS}$, so that in the series circuit including these two capacitances $C_{GS}$, $C_{GFP}$ the gate-field-plate capacitance $C_{GFP}$ is dominant. Further, drain-source capacitance $C_{DS}$ may be neglected compared with drain-field-plate capacitance $C_{DFP}$, and gate-drain capacitance $C_{GD}$ may be neglected.

The parasitic oscillator circuit that is excited when switching low-side switch M can therefore be reduced to a circuit illustrated in FIG. 5B. Such circuit includes the stray inductance $L_{STRAY}$, the drain-field-plate capacitance $C_{DFP}$, the gate-field-plate capacitance $C_{GFP}$, and the field-plate resistance $R_{FP}$, with the stray inductance $L_{STRAY}$ and the drain-field-plate capacitance $C_{DFP}$ being connected in series, and with a parallel circuit including the gate-field-plate capacitance $C_{GFP}$, and the field-plate resistance $R_{FP}$ being connected in series with the series circuit including the stray inductance $L_{STRAY}$ and the drain-field-plate capacitance $C_{DFP}$.

Oscillations of the parasitic oscillator can be damped, and voltage overshoots can therefore be reduced, by increasing a resistance value of field-plate resistance $R_{FP}$ and/or by reducing a capacitance value of gate-field-plate capacitance $C_{GFP}$. The capacitance value of gate-field-plate capacitance $C_{GFP}$ decreases with an increasing thickness of the inter-electrode dielectric 31.

A thickness of the inter-electrode dielectric 31 is at least half (50%) of a vertical length of the field electrode 11. Since the thickness of the inter-electrode dielectric 31 and a vertical length of the field electrode 11 may vary in a lateral direction of the trench, this relationship is at least valid in the middle of the trench, the middle of the trench being the middle between two mesa regions that adjoin the trench 103 on opposite sides. According to an example the thickness of the inter-electrode dielectric 31 is less than, or equal to, the vertical length of the field electrode 11. In this case a relationship between the thickness $d_{31}$ of the inter-electrode dielectric 31 and the vertical length $l_{11}$ of the field electrode 11 is between 1:2 and 1:1.

The depth (vertical dimension) of the trench 103 affects the output capacitance of the transistor component, with the output capacitance increasing with increasing trench depth. To a given trench depth a given output capacitance corresponds. For a given trench depth an arrangement including the inter-electrode dielectric 31 and the field electrode 11 have a given vertical dimension. For a given output capacitance increasing the thickness of the inter-electrode dielectric 31 results in a decreasing vertical length of the field electrode 11. Decreasing the vertical length of the field-electrode, however, decreases its cross section, and therefore increases its resistance. For a given output capacitance increasing the thickness of the inter-electrode dielectric therefore affects both, the gate-field-plate-capacitance $C_{GFP}$—that is decreased—and the field plate resistance—that is increased. Both effects improve damping of parasitic oscillations.

For further increasing the field-plate resistance additional measures may be taken. These measures may include increasing a line resistance of a connection line between the source terminal S and the field plate. This may involve adjusting the resistance of the contact electrode 11' that has been illustrated with reference to FIG. 2.

The method as illustrated with reference to FIG. 1 allows to adjust the thickness of inter-electrode dielectric 31 independently of the field electrode dielectric 21 and gate dielectric 41.

When making slight modifications the method as illustrated with reference to FIG. 1 may also be used for producing an edge termination of a transistor component. An edge termination is a structure that terminates the transistor cell area. The edge termination may be arranged close to the edge of the semiconductor body. However, the edge termination can also be arranged distant to the edge, in particular if besides the transistor component other components, like logic circuits, are integrated in the semiconductor body.

Figure 6A:
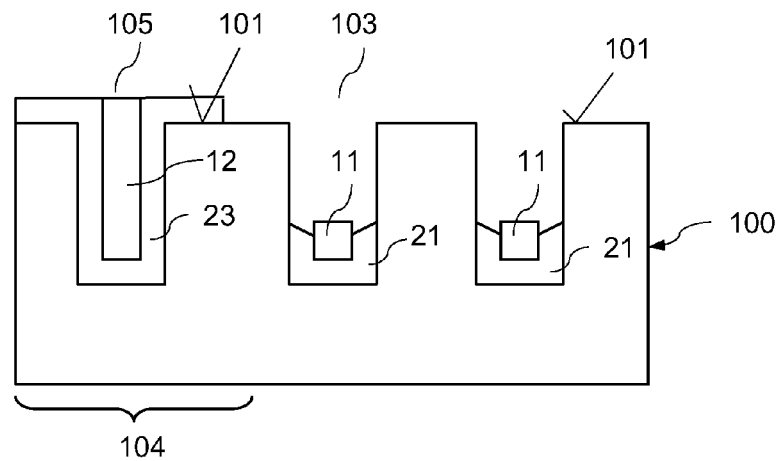
FIGS. 6A-6J, illustrate one embodiment of a method of producing an edge termination of a transistor component using the method processes as illustrated in FIG. 1.

An example of a method for producing edge terminations using the methods as illustrated with reference to FIG. 1 will no be illustrated with reference to FIGS. 6A through 6J. Referring to FIG. 6A semiconductor body 100 includes a second trench 105 in an edge region 104, the second trench 105 extending into the semiconductor body 100 starting from first side 101. For a better understanding first trenches 103 each including a first field electrode 11 are also illustrated in FIGS. 6A through 6J. The first trenches 103 illustrated in these figures are two of a plurality of first trenches 103. The region in which the first trenches are disposed will be referred to as cell region in the following.

Second trench 105 includes a second field electrode 12 that is insulated from the semiconductor body 100 by a second field electrode dielectric 23. The second field electrode dielectric 23 concerning its material and thickness may correspond to the first field electrode dielectric 21. The second field electrode 12 in a vertical direction extends to the first side 101 or beyond the first side 101 of the semiconductor body 100. The second field plate dielectric 23 covers the front side 101 in the edge region 104 and the side wall of trench 103' that lies in the direction of the second trench 105.

Figure 6B:
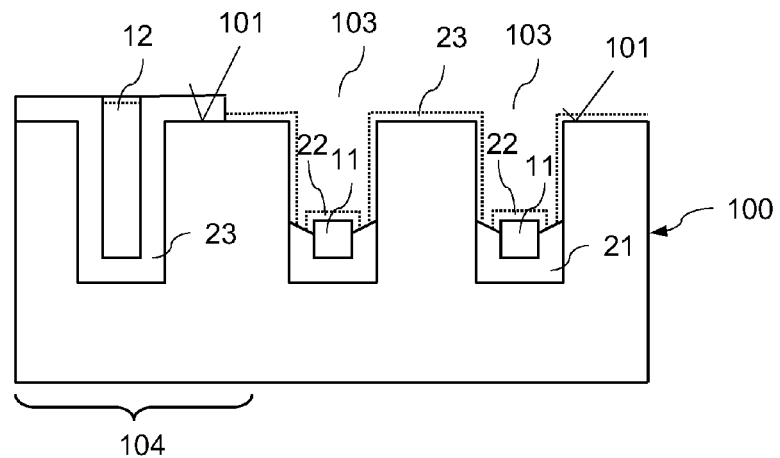

Referring to FIG. 6B in the optional method process of producing a thin dielectric layer 22 on the first field electrode 11 a thin dielectric layer 22 is also produced on the second field electrode 12.

Figure 6C:
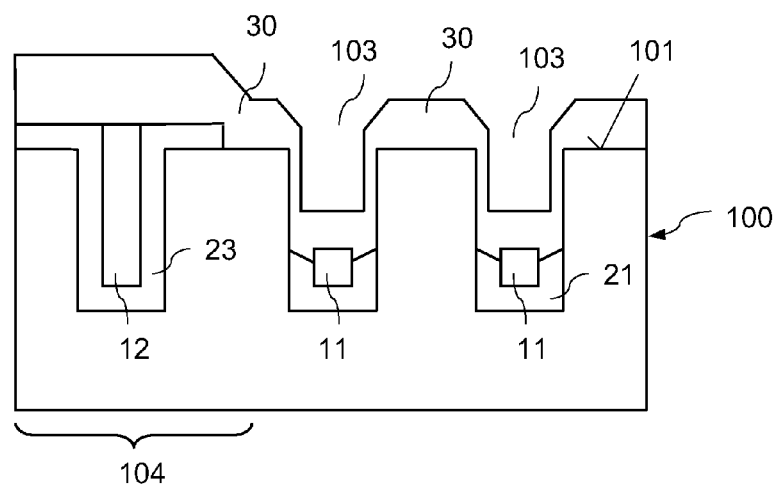

Referring to FIG. 6C dielectric layer 30 that is deposited on the first field electrode 11 in the first trench 103 in the edge region 104 is deposited on the second field electrode dielectric 23 and on the second field electrode 12.

Figure 6D:
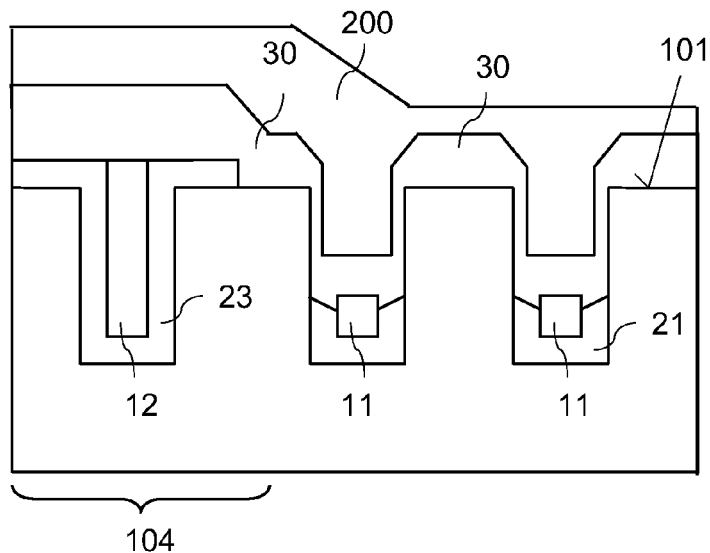
Figure 6E:
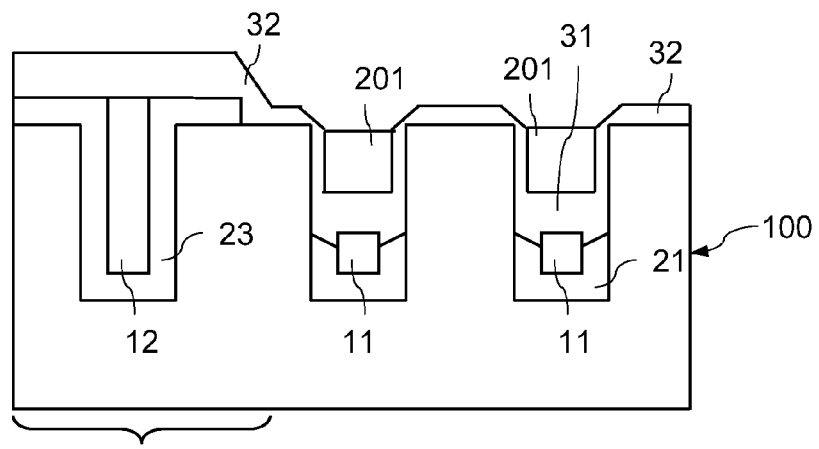
Figure 6F:
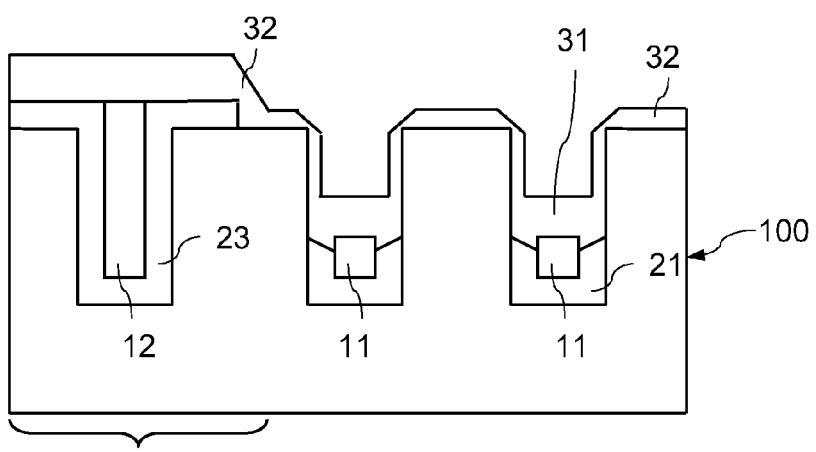
Figure 6G:
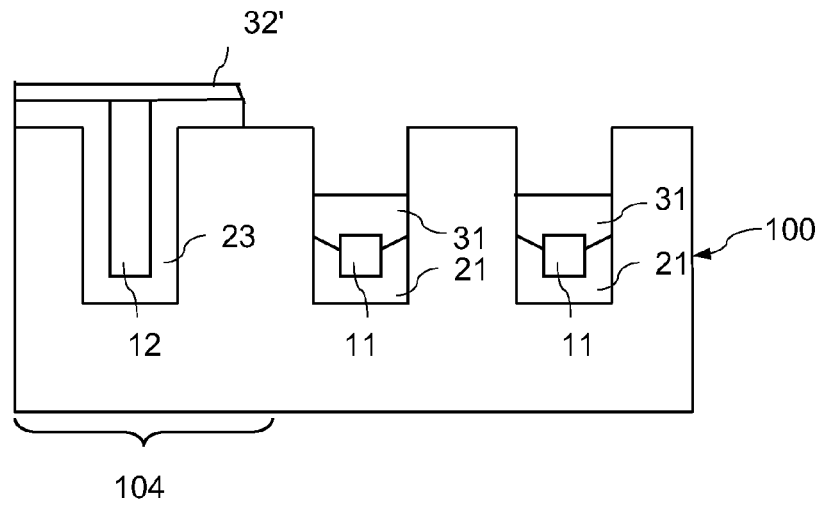
Figure 6H:
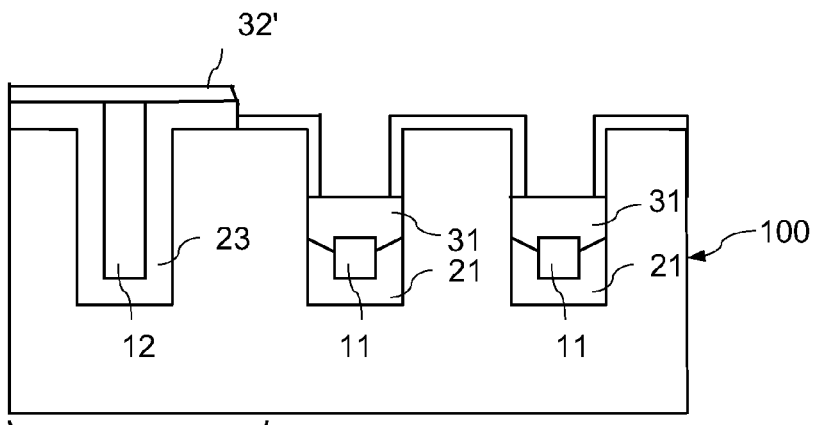
Figure 6I:
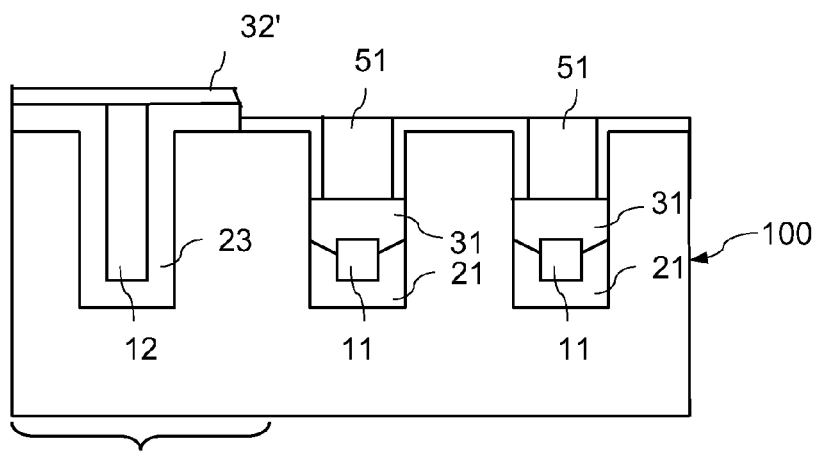
Figure 6J:
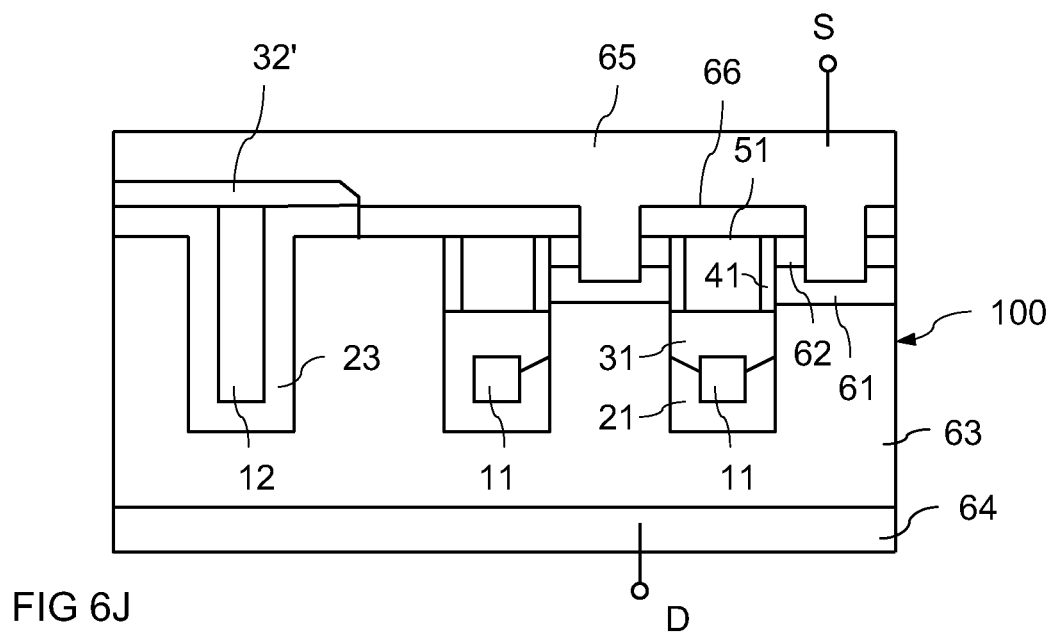

Referring to FIG. 6D protection layer 200 that fills the upper trench section of the first trenches 103 completely covers dielectric layer 30 in the edge region 104. Protection layer 200 is thicker above the dielectric layer 30 in the edge region 104 than above the dielectric layer 30 in the cell region because a significant amount of the protection layer that is applied on the cell region flows into the first trenches 103 and completely fills these trenches 103.

After the method process that removes protection layer 200 above the front side 101 and that at least partly removes dielectric layer 30 above the first side 101 a part 32' of dielectric layer 30 remains above the first side 101 in the edge region 104. The part 32' of the dielectric layer 30 that remains in the edge region is thicker than the part 32 remaining in the cell region. That reason is that the protection layer has different thicknesses in the edge region and in the cell region. When removing the protection layer 200 dielectric layer 30 is completely uncovered in the cell region earlier than in the edge region, so that during this process more from the dielectric layer is removed in the cell region than in the edge region 104. Protection layer 200 is completely removed both, in the cell and in the edge region.

The etch termination structure that includes the second field electrode 12 and the second field dielectric 30 and that is covered by a part of dielectric layer 30 is not affected by the subsequent method processes of forming a gate dielectric and a gate electrode in the first trench 103. These method processes that are illustrated in FIGS. 6F to 6I and that have already been explained with reference to FIGS. 3D and 1C to 1E include removing the protection layer plug 201 from the first trench 103 (see FIG. 6F), removing the dielectric layer 103 from the side walls of the upper trench sections of the first trench 103 (see FIG. 6G), forming the gate dielectric 41 (see FIG. 6H) and forming gate electrode 51 (see FIG. 6I).

Figure 7A:
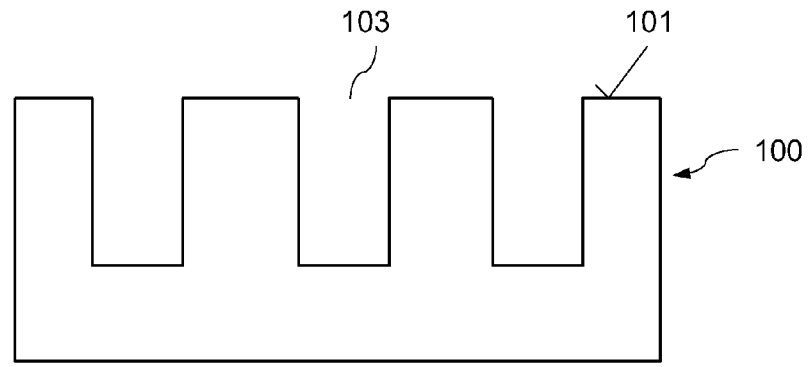
FIGS. 7A-7E, illustrate one example embodiment of a method of producing a semiconductor arrangement as illustrated in FIG. 1A.

The process sequence that has been illustrated with reference to FIGS. 1A through 1E starts with the semiconductor arrangement that includes a first field electrode 11 in at least one first trench 103. An example of a method for producing such semiconductor arrangement will now be explained with reference to FIGS. 7A through 7E. Referring to FIG. 7A in a first method process first trenches 103 are produced in a semiconductor body 100. Forming the trenches may involve any known method for forming trenches in a semiconductor body, such as etching processes.

Figure 7B:
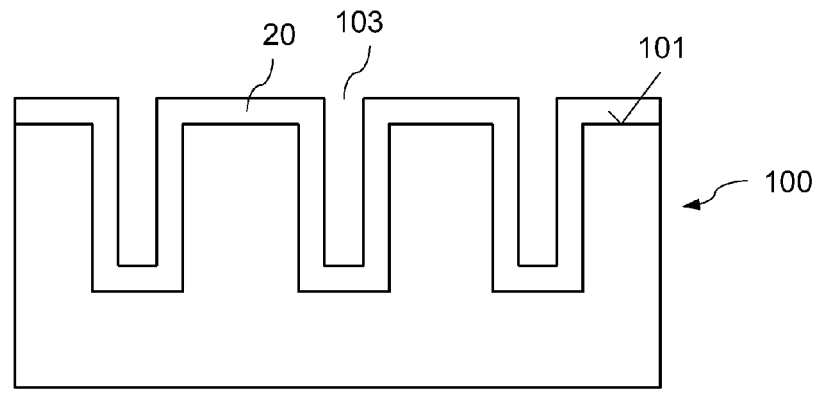

Referring to FIG. 7B a field electrode dielectric layer 20 is formed on the first side 101, on sidewalls and at the bottom of the first trenches 103. This field electrode layer 20 in a later stage forms the first field electrode dielectric (21 in FIGS. 1B through 1E). Forming the field electrode dielectric layer 20 may involve a thermal oxidation and/or a deposition process.

Figure 7C:
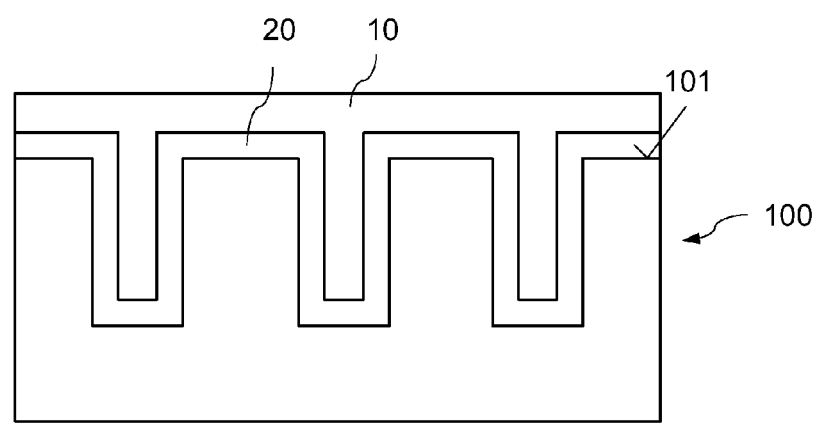

Referring to FIG. 7C an electrode layer 10 that, at a later stage, forms the first field electrode 11 is deposited so as to completely fill the first trenches 103.

Figure 7D:
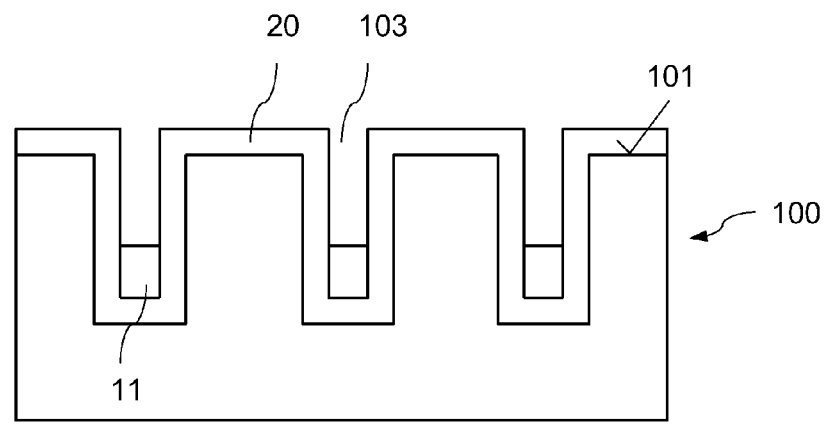

Referring to FIG. 7D electrode layer 10 is etched back in the first trenches 103 so as to form the first field electrodes 11 in the bottom section 103A of the first trenches 103. Etching back the electrode layer 11 may involve an anisotropic etch process.

Figure 7E:
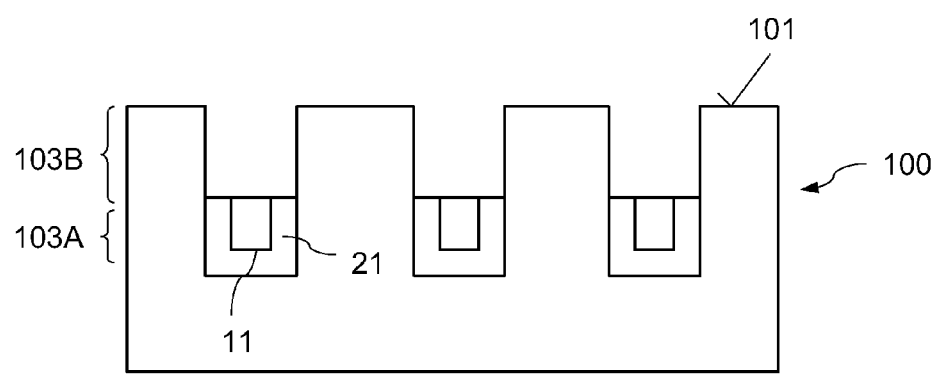

Referring to FIG. 7E field electrode dielectric layer 20 is removed from the first side 101 and the sidewalls of the upper trench sections 103B. This may involve an isotropic etch process. The process as illustrated with reference to FIGS. 7A through 7E is also suitable for forming a second field electrode 12 as illustrated in FIGS. 6A through 6I. For forming the second field electrode 12 electrode layer 10 (see FIG. 7C) is first removed down to the field electrode dielectric layer 20. Then the trench in which the second field electrode 12 is to be produced is covered by a protection layer and stays covered until the end of the process processes illustrated in FIGS. 7D and 7E.

According to a further embodiment of a method of producing a transistor component a gated diode structure, also commonly known as MOS gates diode structure or MOS diode structure, is formed in at least one third trench 106 of the semiconductor body 100 before the method processes that have been illustrated with reference to FIGS. 1A through 1E are performed. An example of a process sequence for forming such gated diode structure will now be illustrated with reference to FIGS. 8A through 8F. These figures schematically illustrate a vertical cross section through the semiconductor body 100 at various stages of the process sequence.

Figure 8A:
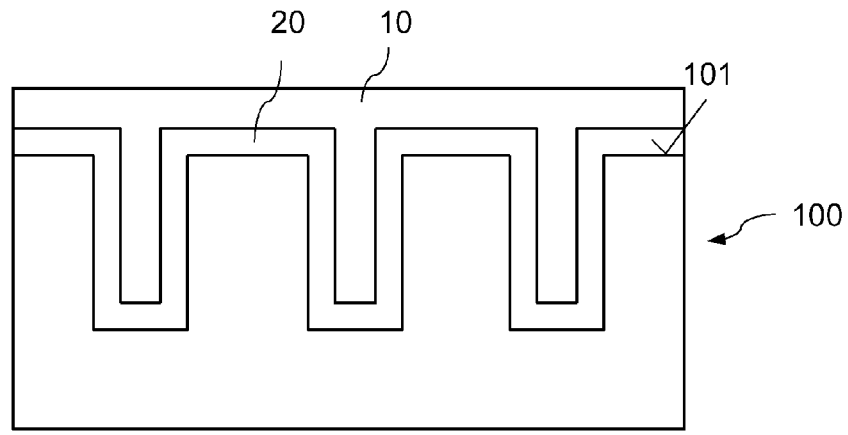
FIGS. 8A-8F illustrate one example embodiment of a method of producing a MOS gated diode component.

Referring to FIG. 8A the process sequence for forming the gated diode structure starts with the semiconductor arrangement that has been illustrated with reference to FIG. 7C and that includes trenches that have their side walls and bottom covered with the field electrode dielectric layer 20 and that are filled with the electrode material 10. Electrode layer 10 is, for example, deposited so as to completely cover field electrode dielectric layer 20.

Figure 8B:
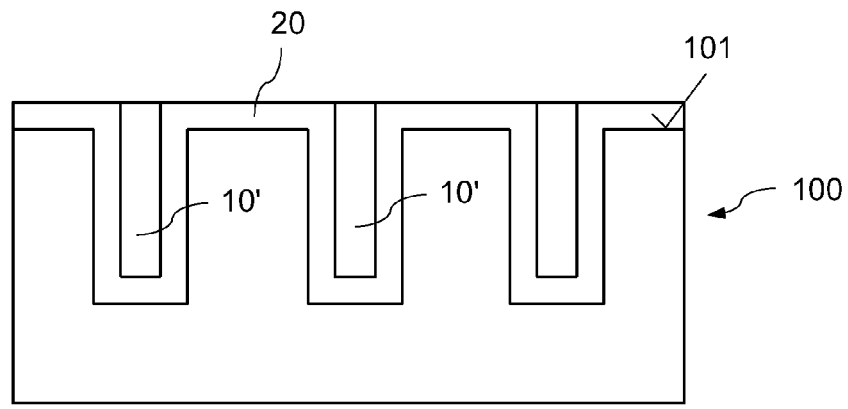

Referring to FIG. 8B electrode layer 10 is then removed down to the field electrode dielectric layer 20 above the first side 101 but stays in the trenches. Reference symbol 10' designates plugs of the electrode material that remain after removing electrode layer 10 above the first side 101.

Referring to FIG. 6C the plug 10' in at least one of the trenches is then covered by a protection layer 301. The trench in which the protected plug 1β' is arranged will be referred to as third trench 106 in the following. The contact plug in this third trench forms a third field electrode 13, which is a field electrode of the gated diode structure. For illustration purposes trenches that have their electrode plugs not covered by a protection layer are also illustrated in FIGS. 8A through 8F. These trenches are first trenches 103 in which first field electrodes 11 and gate electrodes will be formed.

Figure 8C:
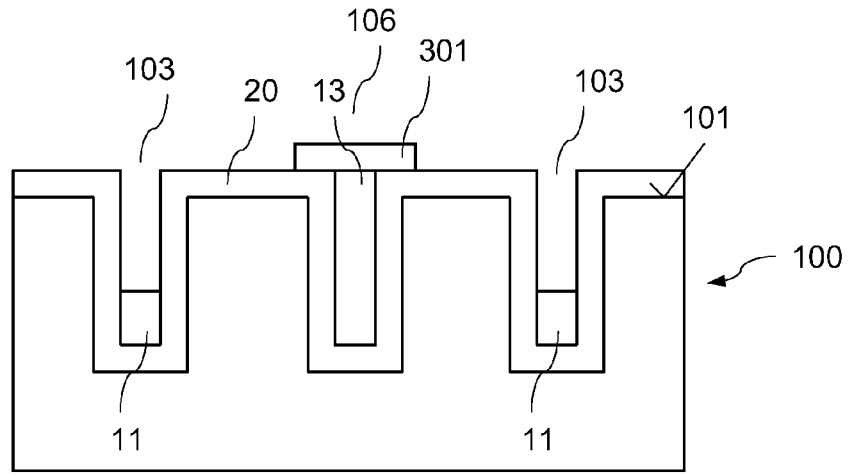

Referring to FIG. 8C protection layer 301 protects the third field electrode 13 from being etched when etching electrode plugs 10' in the first trenches 103 to form the first field electrodes 11.

Figure 8D:
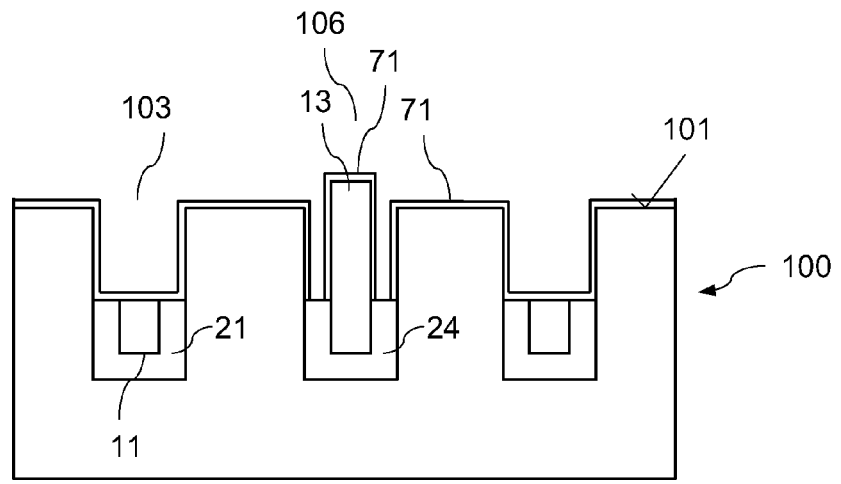

Referring to FIG. 8D protection layer 301 is removed and field electrode dielectric layer 20 is removed from the first side 101, and from sidewalls of the upper trench sections of first and third trenches 103, 106. Removing the field electrode dielectric layer 20 from the sidewalls of the upper trench sections involves, for example, an isotropic etch process. After removing dielectric layer 20 from the side walls of the upper trench sections dielectric layer 20 still covers the bottom and the side walls of the lower trench sections, thereby forming the first field electrode dielectric 21 in the first trenches 103 and a third field electrode dielectric 24 in the third trench 106.

By removing field electrode dielectric layer 20 from sidewalls of the upper trench section in the third trench 106 a space is formed between third field electrode 13 and the sidewalls of the third trench 106 in the upper trench section. Also referring to FIG. 8D a dielectric layer 71 is formed on the third field electrode 13 and on the sidewalls of the third trench 106 in the upper trench section. Forming this dielectric layer 71 may include a thermal oxidation process and/or a deposition process. In this process the dielectric layer 71 is also formed on the first side 101 and on a bottom and on the sidewalls of the at least one first trench 103. This dielectric layer may correspond to the optional dielectric layer 22 that has been explained with reference to FIG. 1B.

Figure 8E:
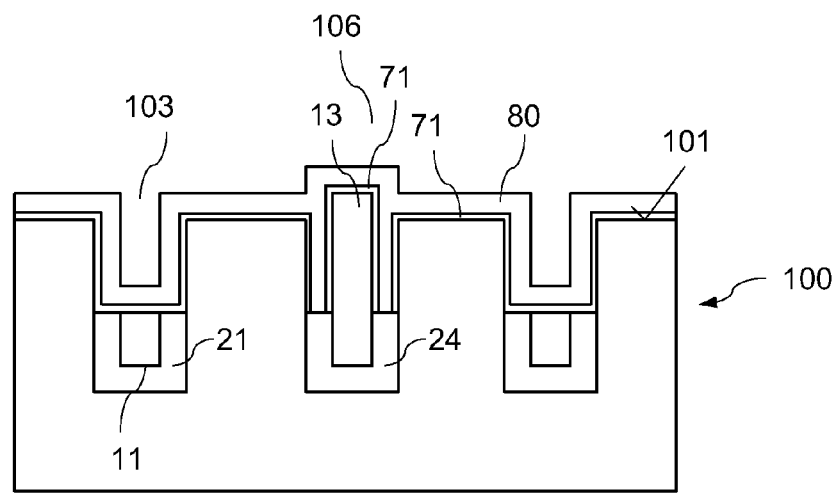
Figure 8F:
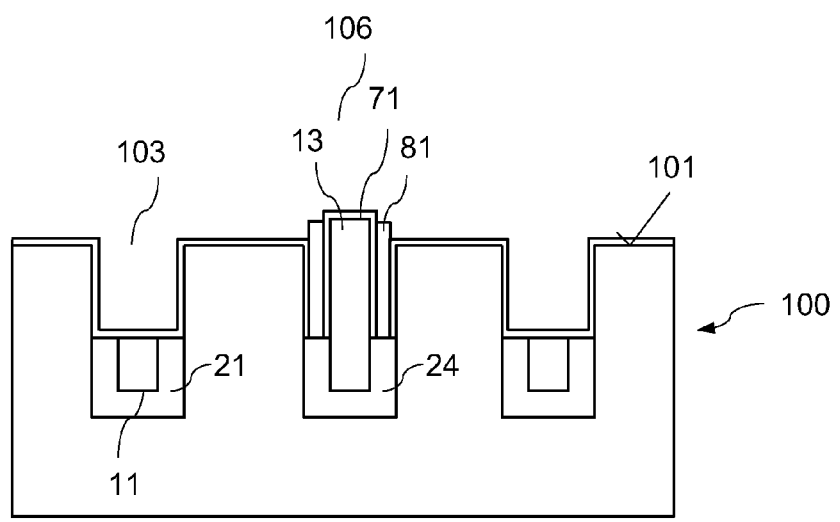

The thickness of dielectric layer 71 is selected so that dielectric layer 71 does not completely fill the space between third field electrode 13 and the semiconductor body 100. Referring to FIG. 8E this space is filled by an electrode material. Filling the space may involve depositing an electrode layer 80 on the semiconductor arrangement. Subsequently, as illustrated in FIG. 8F, electrode layer 80 is removed from the first side 101 and from sidewalls and the bottom of the at least one third trench 103, but remains in the space between the third field electrode 13 and the semiconductor body 100, forming a gate electrode 81. Those parts of the gate diode structure that are arranged in the third trench 106 are completed at the end of the method process illustrated in FIG. 8F. Starting with the structure illustrated in FIG. 8F the method processes as illustrated with reference to FIG. 1 can now be performed in order to complete the transistor structures in the first trenches 103.

Figure 9:
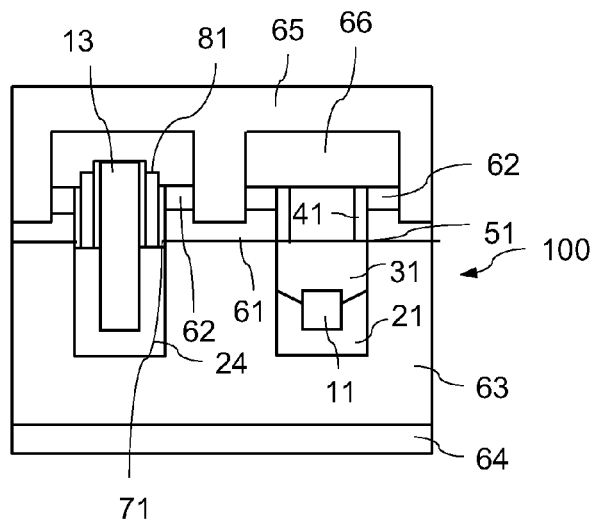
FIG. 9 illustrates one embodiment of a vertical cross section through a transistor component including at least one transistor cell and at least one MOS gated diode structure.

FIG. 9 illustrates a vertical cross section through a device that is obtained by applying the method processes as illustrated with reference to FIG. 1 on the semiconductor arrangement illustrated in FIG. 8F. FIG. 9 illustrates a section of the component in which the transistor cell and a MOS gated diode cell are arranged. MOS gated diode structure includes gate electrode 81, source zone 62 and body zone 61. Gate electrode 81 of the MOS gated diode structure may be connected to the source terminal S of the transistor. The third field plate 71 is connected to the source terminal of the transistor. By connecting the gate electrode 81 of the diode structure to source terminal the diode conducts or blocks dependent on a voltage difference between the source and the drain terminal. In an n-type transistor the MOS gated diode conducts each time the voltage at source terminal S rises above the voltage at the drain terminal D. In this case an n-channel is formed in body zone 61 along gate dielectric 71 between drift zone 63 and source zone 62 due to the very low threshold voltage of the MOS gated diode.

In one embodiment, the function of the MOS gated diode structure is substantially the same as the function of the body diode. However, forward voltage drop and reverse storage charge of the MOS gated diode is lower as compared to the conventional body diode.

As it has been discussed with reference to FIGS. 4 and 5 the cross section of the field electrodes 11 influences the field-plate resistance $R_{FP}$. Besides the cross section the field plate resistance may be influenced or adjusted by suitably selecting the electrical resistance of an connection line between the source electrode 65 and the field electrodes 11. In an arrangement in which the field electrodes 11 are contacted by second contact electrodes (see 11' in FIGS. 2A and 2B) the electrical resistance of the connection line is dependent on the cross section of the second contact electrodes 11' and on the number of second contact electrodes 11'. This will be explained with reference to FIG. 10.

Figure 10:
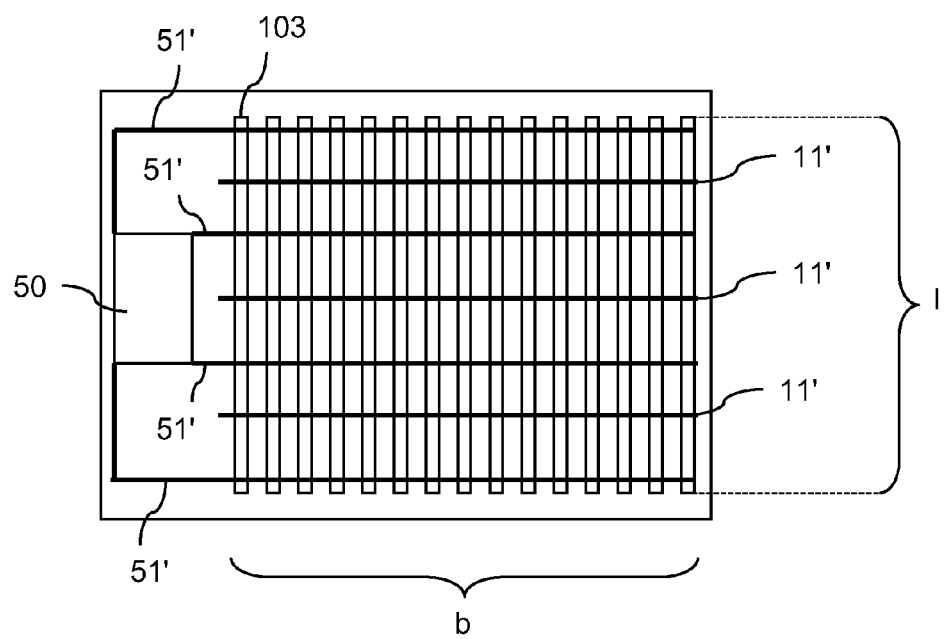
FIG. 10 schematically illustrates one embodiment of a semiconductor component having several contact trenches with contact electrodes for contacting the gate and the field electrodes in a transistor arrangement having stripe-shaped transistor cells.

FIG. 10 schematically illustrates a top view on a semiconductor body 100 in which active areas, gate electrodes and field electrodes of stripe-shaped transistor cells are integrated. In the schematic drawing of FIG. 10 only the trenches 103—in which the gate and the field electrodes are arranged—of the stripe-shaped transistor cells are illustrated. The gate electrodes arranged in the trenches 103 are contacted by first contact electrodes 51' that—in the example—run perpendicular to the gate electrodes. Referring to FIGS. 2A and 2B the first contact electrodes 51' may be arranged in trenches. The field electrodes arranged in the trenches are contacted by second contact electrodes 11' that—in the example—run perpendicular to the field electrodes. Referring to FIGS. 2A and 2B the second contact electrodes 11' may be arranged in trenches. It should be noted that FIG. 10 serves to illustrate the position of the trenches 103 and the contact electrodes 51', 11', so that the contact electrodes 51', 11' are only schematically illustrated. Insulation layers that, for example, insulate the second contact electrode from the gate electrode are not illustrated.

The arrangement according to FIG. 10 includes a gate pad 50 to which the first contact electrodes 51' are electrically coupled. Gate pad 50 is connected to the gate terminal G (not illustrated in FIG. 10) that serves for applying a gate potential. The second contact electrodes 11' that contact the field electrodes are contacted by the source electrode 65 (not illustrated in FIG. 10). For the arrangement in FIG. 10 the field plate resistance $R_{FP}$ that has been explained with reference to FIG. 4 is approximately given by $$R_{FP} = \frac{1}{3}\rho \frac{p}{A} \cdot \frac{1}{(n+2m)^2} \cdot \frac{l}{b} \quad (1)$$

where

μ is the specific resistance of the material of the field plate;
p is the cell pitch, which is the distance between the middle of one trench 103 and the middle of the neighboring trench 103;
A is the cross section of the field plate 11;
n is the number of connections to the field plates 11 at the edge of the cell area;
m is the number of connections to the field plates 11 in the cell area;
l is the length of the transistor cells;
b is the width of the cell area, which is the dimension in a direction perpendicular to a longitudinal direction of the transistor cells.

In the example according to FIG. 10 n=0 and m=3, with m being the number of the second contact electrodes 11'. It should be noted that using m=3 second contact electrodes 11' is only an example. It goes without saying that any number other than 3 may be used as well, where m is, in particular, greater than 1. Referring to eqn. (1) besides the cross section A the field plate resistance $R_{FP}$ may be adjusted by varying the number of second contact electrodes 11', the field plate resistance $R_{FP}$ decreasing with the number of second contact electrodes 11' increasing.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of forming a transistor component, including:
providing a semiconductor arrangement including: a semiconductor body having a first side, at least one first trench extending from the first side, and having sidewalls and lower and upper trench sections, a first field electrode arranged in the lower trench section of the at least one first trench and being insulated from the semiconductor body by a field electrode dielectric, at least one second trench in the semiconductor body, the at least one second trench having sidewalls and lower and upper sidewall sections, and a second field electrode arranged in lower and upper trench sections of the at least one second trench and being insulated from the semiconductor body by the field electrode dielectric;
forming a dielectric layer on the first field electrode in the at least one first trench, forming the dielectric layer including a deposition process that deposits a dielectric material on the first side of the semiconductor body and on the field plate at a higher deposition rate than on sidewalls of the at least one first trench;
forming a gate dielectric, the gate dielectric at least lining the sidewalls in the upper trench section of the at least one first trench;
forming a gate electrode in the upper trench section, gate electrode being insulated from the first field electrode by the dielectric layer.

2. The method of claim 1, wherein the dielectric layer is also deposited on the at least one second field electrode.

3. The method of claim 1, wherein forming the MOS gated diode structure includes:
forming a third field electrode in the lower and upper sections of the at least one third trench;
forming a third field electrode dielectric layer insulating the third field electrode from the semiconductor body in the lower trench section of the at least one third trench;
forming a diode gate electrode between the field electrode and the semiconductor body in the upper section of the at least one third trench, the diode gate electrode in the at least one third trench being insulated from the semiconductor body and the third field electrode by a diode gate dielectric.

4. A method of making a device comprising:
providing a semiconductor arrangement including a semiconductor body having at least one first trench extending from a first side, the at least one first trench having sidewalls and lower and upper trench sections, a first field electrode arranged in the lower trench section and being insulated from the semiconductor body by a field electrode dielectric;
forming a dielectric layer on the first field electrode including depositing a dielectric material on the first side of the semiconductor body and on the first field electrode at a higher deposition rate than on sidewalls of the at least one first trench;
forming a gate dielectric, at least lining the sidewalls in the upper trench section; and
forming a gate electrode in the upper trench section, insulated from the first field electrode by the dielectric layer,
wherein forming the dielectric layer further includes:
producing a protection layer covering the dielectric layer in the at least one first trench and on the first side, the protection layer completely filling the at least one first trench;
completely removing the protection layer above the first side and at least partly removing the dielectric layer on the first side, and at least partly leaving the protection layer in the at least one first trench; and
removing the protection layer from the at least one first trench.

5. The method of claim 4, wherein completely removing the protection layer above the first side and at least partly removing the dielectric layer on the first side includes an etch process that etches the material of the protective layer and the material of the dielectric layer.

6. The method of claim 5, wherein the dielectric layer is an oxide layer, or a nitride layer.

7. The method of claim 5, wherein the protective layer is a resist layer, a carbon layer, or a carbon-containing layer.

8. The method of claim 4, wherein removing the protection layer from the at least one first trench includes an etch process that selectively etches the material of the protect layer.

9. The method of claim 4, further including:
depositing the dielectric layer on the sidewalls in the upper trench section when depositing the dielectric layer on the field plate and on the first side of the semiconductor body;
completely removing the dielectric layer from the first side of the semiconductor body and from the sidewalls of the at least one first trench after removing the protection layer before forming the gate dielectric.

10. The method of claim 4, further including:
forming source and body zones adjacent to the gate dielectric in the semiconductor body after forming the gate electrode.

11. The method of claim 4, wherein the semiconductor arrangement further includes:
at least one third trench having lower and upper trench sections, and
a MOS gated diode structure arranged in the trench.

12. A method of making a device comprising:
providing a semiconductor arrangement including a semiconductor body having at least one first trench extending from a first side, the at least one first trench having sidewalls and lower and upper trench sections, a first field electrode arranged in the lower trench section and being insulated from the semiconductor body by a field electrode dielectric;
forming a dielectric layer on the first field electrode including depositing a dielectric material on the first side of the semiconductor body and on the first field electrode at a higher deposition rate than on sidewalls of the at least one first trench;
forming a gate dielectric, at least lining the sidewalls in the upper trench section; and
forming a gate electrode in the upper trench section, insulated from the first field electrode by the dielectric layer;
wherein the semiconductor arrangement further includes:
at least one third trench having lower and upper trench sections, and
a MOS gated diode structure arranged in the trench.

13. The method of claim 12, wherein forming the dielectric layer further includes:
producing a protection layer covering the dielectric layer in the at least one first trench and on the first side, the protection layer completely filling the at least one first trench;
completely removing the protection layer above the first side and at least partly removing the dielectric layer on the first side, and at least partly leaving the protection layer in the at least one first trench; and
removing the protection layer from the at least one first trench.

14. The method of claim 13, wherein completely removing the protection layer above the first side and at least partly removing the dielectric layer on the first side includes an etch process that etches the material of the protective layer and the material of the dielectric layer.

15. The method of claim 14, wherein the dielectric layer is an oxide layer, or a nitride layer.

16. The method of claim 14, wherein the protective layer is a resist layer, a carbon layer, or a carbon-containing layer.

17. The method of claim 13, wherein removing the protection layer from the at least one first trench includes an etch process that selectively etches the material of the protect layer.

18. The method of claim 12, further including:
depositing the dielectric layer on the sidewalls in the upper trench section when depositing the dielectric layer on the field plate and on the first side of the semiconductor body;
completely removing the dielectric layer from the first side of the semiconductor body and from the sidewalls of the at least one first trench after removing the protection layer before forming the gate dielectric.

19. The method of claim 12, further including: forming source and body zones adjacent to the gate dielectric in the semiconductor body after forming the gate electrode.

* * * * *